United States Patent
Ju

(10) Patent No.: US 7,885,113 B2
(45) Date of Patent: Feb. 8, 2011

(54) METHOD OF CONTROLLING A PROGRAM CONTROL OF A FLASH MEMORY DEVICE

(75) Inventor: Gi Seok Ju, Kyeongki-do (KR)

(73) Assignee: Hynix Semiconductor Inc, Icheon-si (KR)

( * ) Notice: Subject to any disclaimer, the term of this patent is extended or adjusted under 35 U.S.C. 154(b) by 0 days.

(21) Appl. No.: 12/508,922

(22) Filed: Jul. 24, 2009

(65) Prior Publication Data

US 2009/0285025 A1    Nov. 19, 2009

Related U.S. Application Data

(62) Division of application No. 11/306,350, filed on Dec. 23, 2005, now abandoned.

(30) Foreign Application Priority Data

Jun. 29, 2005    (KR) ................. 2005-57277

(51) Int. Cl.
G11C 11/04  (2006.01)
(52) U.S. Cl. ................. 365/185.12
(58) Field of Classification Search ............ 365/185.28, 365/185.12
See application file for complete search history.

(56) References Cited

U.S. PATENT DOCUMENTS

| 5,485,128 | A | 1/1996 | Azuma |
| 5,920,504 | A | 7/1999 | Lee et al. |
| 6,304,486 | B1 | 10/2001 | Yano |
| 6,798,697 | B2 | 9/2004 | Hosono et al. |
| 6,925,005 | B2 * | 8/2005 | Kawamura et al. ..... 365/185.12 |
| 2001/0048541 | A1 | 12/2001 | Ishii |
| 2002/0118569 | A1 * | 8/2002 | Jeong et al. ............ 365/185.18 |
| 2003/0133340 | A1 | 7/2003 | Lee |
| 2006/0133145 | A1 * | 6/2006 | Park et al. ............... 365/185.12 |
| 2006/0146609 | A1 * | 7/2006 | Lee et al. ................ 365/185.17 |

FOREIGN PATENT DOCUMENTS

JP    363127495    5/1998

OTHER PUBLICATIONS

Office action in corresponding Korean Application No. 2005-57277 dated Aug. 16, 2006.

* cited by examiner

*Primary Examiner*—Hoai V Ho
*Assistant Examiner*—Anthan T Tran
(74) *Attorney, Agent, or Firm*—Marshall, Gerstein & Borun LLP

(57) ABSTRACT

A flash memory device and method of controlling a program operation thereof, includes page buffers divided into a predetermined number of groups and a program operation is performed on a group basis.

4 Claims, 6 Drawing Sheets

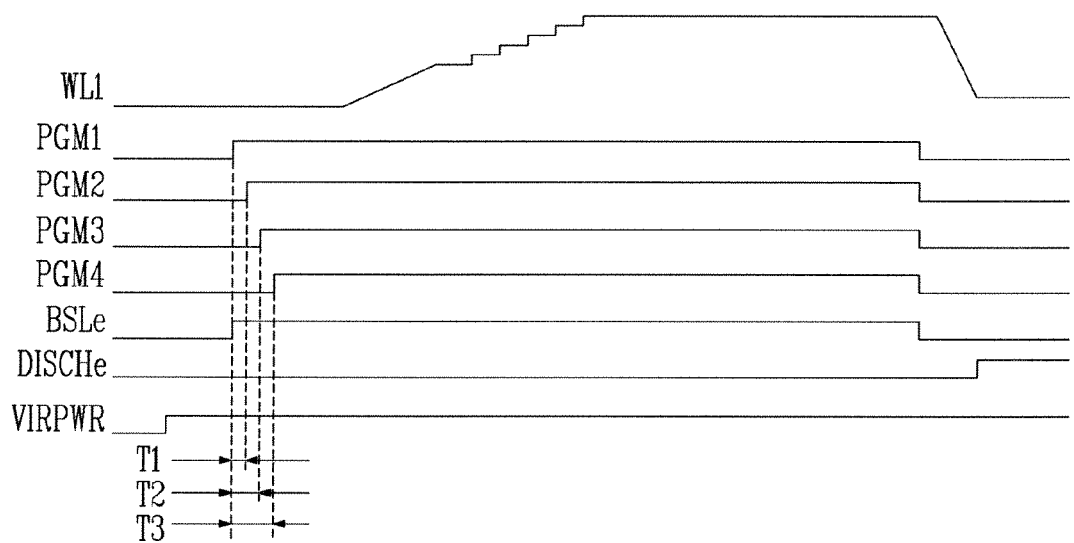

US 7,885,113 B2

METHOD OF CONTROLLING A PROGRAM CONTROL OF A FLASH MEMORY DEVICE

CROSS-REFERENCE TO RELATED APPLICATIONS

This is a division of U.S. application Ser. No. 11/306,350 filed Dec. 23, 2005, which claims the priority benefit under USC 119 of KR 2005-57277 filed Jun. 29, 2005, the entire respective disclosures of which are incorporated herein by reference.

BACKGROUND

This disclosure relates to semiconductor memory devices, and more particularly, to flash memory devices.

In general, a flash memory device includes a page buffer for programming or reading a large quantity of data within a short time. Therefore, the program operation or read operation of the flash memory device is performed by the page buffer on a page basis.

FIG. 1 is a schematic block diagram of a flash memory device in the related art. It should be noted that only a memory cell block 11 and page buffers 12 of a flash memory device 10 are shown in FIG. 1.

The memory cell block 11 is connected to each of the page buffers 12 through a plurality of bit lines BLe1, BLo1 to BLeK, BloK (where K is an integer). In the program operation of the flash memory device 10, data to be programmed (not shown) are stored in the page buffers 12. The page buffers 12 output data to memory cells (not shown) of the memory cell block 11 through the corresponding bit lines BLe1 to BLeK or BLo1 to BloK in response to a program control signal (PGM) output from a control unit (not shown). For example, a case where the memory cells connected to the bit lines BLe1 to BleK are programmed will be described in more detail with reference to FIG. 2.

As shown in FIG. 2, in the program operation, when a bit line control signal (VIRPWR) is enabled, a discharge signal (DISCHe) is enabled. As a result, the bit lines BLe1 to BleK are precharged with a voltage (VCC) level according to the bit line control signal (VIRPWR). Thereafter, the discharge signal (DISCHe) is disabled and bit line select signals (BSLe1 to BSLeK) and the program control signal (PGM) are enabled. As a result, the bit lines BLe1 to BleK are connected to sensing nodes (not shown) of the page buffers 12, respectively.

In the case where data "0" is stored in each of the page buffers 12, i.e., memory cells of a corresponding page are all programmed, current flows to the ground through a current path having the bit lines BLe1 to BLeK, the sensing nodes and a latch circuit (not shown) of the page buffer, so that the bit lines BLe1 to BleK are discharged to a ground voltage level. In the case where the page buffers 12 output data "0" to the bit lines BLe1 to BLeK at the same time according to the program control signal (PGM) as described above (i.e., the bit lines BLe1 to BLeK are discharged at the same time), the ground voltage of the flash memory device 10 may rise to a positive voltage. This will be described below in more detail.

For example, in the case where memory cells included in one page of the memory cell block 11 is 2 Kbytes, a peak current, which flows to the ground through page buffers having a number corresponding to that of memory cells in the program operation, is increased. If the increased current flows to the ground through the page buffers 12, the ground voltage level of the flash memory device 10 rises due to a voltage drop generated by the load of the page buffers 12 themselves. That is, a ground voltage bouncing phenomenon is generated. If the ground voltage rises as described above, a problem arises because a flash memory device malfunctions. More particularly, problems incurred by the ground voltage bouncing phenomenon is more profound in a cache program operation using a page buffer having a dual latch structure.

To be more specific, in the cache program operation, a data output operation in which a program is performed and a data input operation in which new data are received are performed at the same time in the page buffer having the dual latch structure. That is, while data stored in a main latch (not shown) are programmed into memory cells, new data for a next program operation are input to a cache latch (not shown).

In general, when data are input to the cache latch, data I/O nodes YG1 to YGK become a ground voltage level. As a result, data "0" is input to the cache latch. As data stored in the main latch is programmed into the memory cells, however, a ground voltage level rises. Therefore, unwanted erroneous data may be input to the cache latch. That is, even though data "0" must be input to the cache latch, data "1," can be input to the cache latch as the ground voltage level rises. As a result, since erroneous data is programmed into the memory cells, the error occurrence ratio rises in the program operation of the flash memory device.

SUMMARY

In one aspect, a flash memory device includes a memory cell block including memory cells that share a plurality of groups of bit line pairs, a plurality of groups of page buffers, where each group of page buffers is connected to a respective group of bit line pairs and is arranged to output program data to memory cells connected to part of the bit line pairs of corresponding groups in response to a program control signal, and a program control unit arranged to consecutively generate the program control signals for each group of page buffers at a predetermined time distance during a program operation. During the program operation, while each of the page buffers of one of the plurality of groups of page buffers outputs the program data to the memory cells connected to any one of a corresponding bit line pair, the page buffers of the remaining groups of page buffers do not output the program data.

In another aspect, a method of controlling a program control of a flash memory device includes storing first program data in a main latch of each of a plurality of groups of page buffers, wherein each group of page buffers is connected to first to a respective group of bit line pairs, outputting an internal program signal in response to a program command, consecutively generating program control signal for each group of page buffers at a predetermined time distance in response to the internal program signal, whenever one of the program control signals is generated, outputting first program data stored in page buffers of any one of the plurality of groups of page buffers to memory cells of a selected page connected to part of bit line pairs of any one of the plurality of groups of bit line pairs in response to the generated program control signal, and while the program control signals are consecutively generated, outputting second program data to cache latches of each of the plurality of groups of page buffers.

BRIEF DESCRIPTION OF THE DRAWINGS

FIG. 8 is a timing diagram of signals relates to the program operation of the flash memory device shown in FIG. 3.

DETAILED DESCRIPTION

Figure 1:
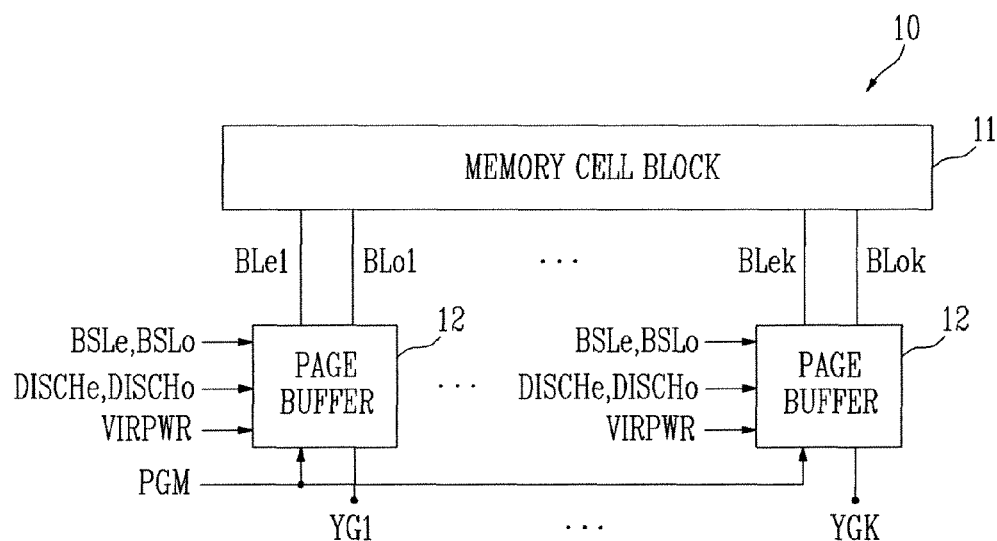
FIG. 1 is a schematic block diagram of a flash memory device in the related art.
Figure 2:
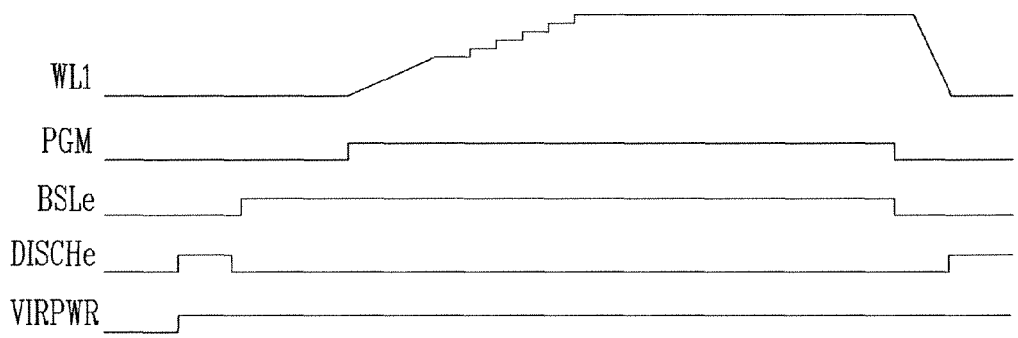
FIG. 2 is a timing diagram of signals related to the program operation of the flash memory device shown in FIG. 1.
Figure 3:
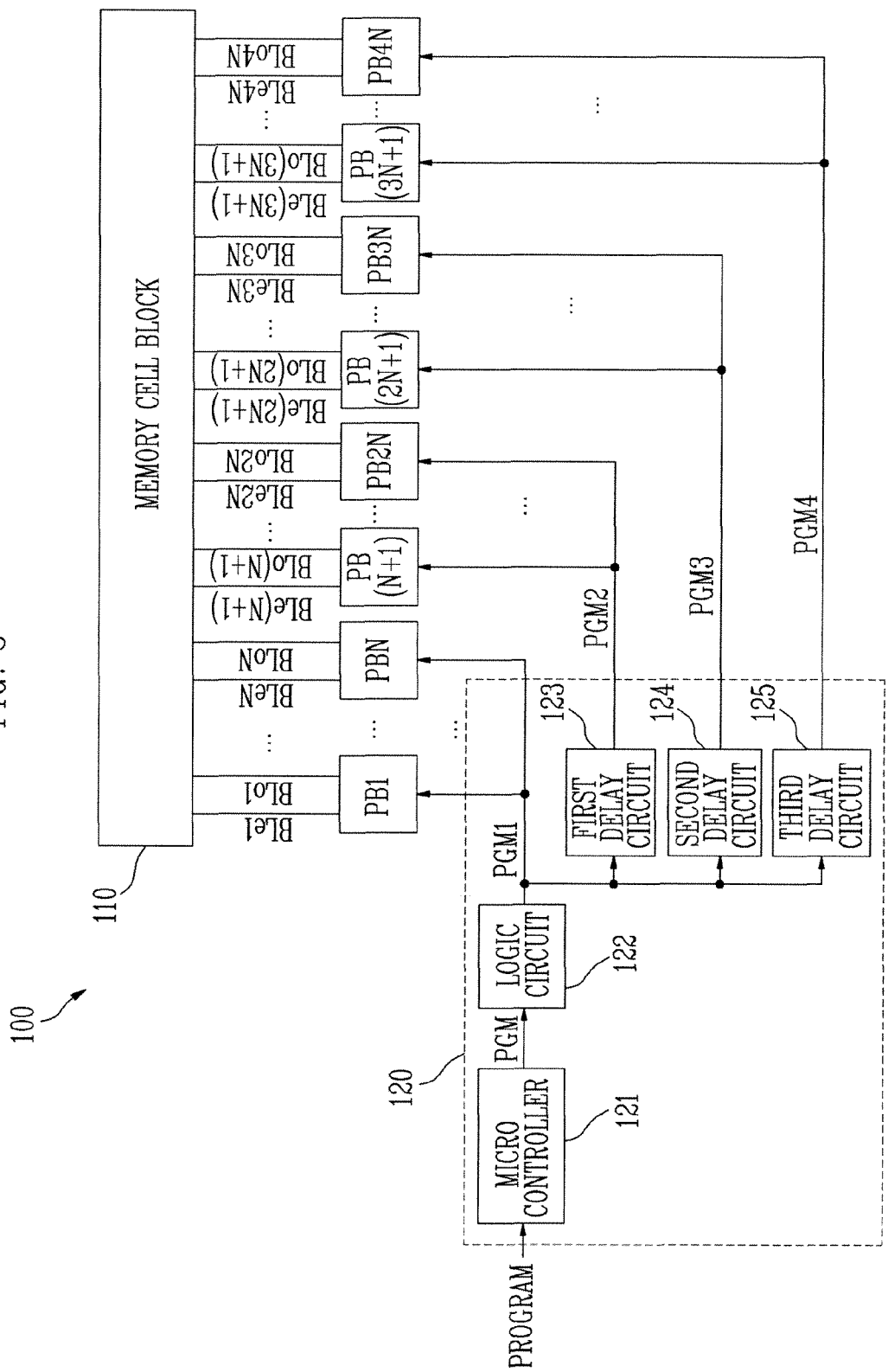
FIG. 3 is a schematic block diagram of a flash memory device.

FIG. 3 is a schematic block diagram of a flash memory device. For the simplification of the drawing, parts that are not directly related to the operation described herein are not shown in FIG. 3.

Referring to FIG. 3, a flash memory device 100 includes a memory cell block 110, first to fourth groups of page buffers PB1 to PB4N and a program control unit 120. The memory cell block 110 includes memory cells (not shown) that share bit line pairs BLe1, BLo1 to BLe4N, BLo4N of the first to fourth groups. The page buffers PB1 to PB4N of the first to fourth groups are connected to the bit line pairs BLe1, BLo1 to BLe4N, BLo4N of the first to fourth groups, respectively.

For example, the first group of the page buffers PB1 to PBN is connected to the first group of the bit line pairs BLe1, BLo2 to BLeN, BLoN, respectively. More particularly, the page buffer PB1 is connected to the bit line pairs BLe1, BLo1 and the page buffer PBN is connected to the bit line pairs BLeN, BloN. The first to fourth groups of the page buffers PB1 to PB4N output program data (not shown) to memory cells connected to part of bit line pairs of a corresponding group in response to the first to fourth program control signals (PGM1 to PGM4), respectively.

To be more concrete, the first group of the page buffers PB1 to PBN performs the output operation of the program data in response to the first program control signal (PGM1). The second group of the page buffers PB(N+1) to PB2N performs the output operation of the program data in response to the second program control signal (PGM2). Furthermore, the third group of the page buffers PB(2N+1) to PB3N performs the output operation of the program data in response to the third program control signal (PGM3). The fourth group of the page buffers PB(3N+1) to PB4N performs the output operation of the program data in response to the fourth program control signal (PGM4). To be more specific, for example, each of the first group of the page buffers PB1 to PBN outputs program data to the memory cells connected to some BLe1 to BLeN or BLo1 to BLoN of the first group of the bit line pairs BLe1, BLo1 to BLeN, BLoN in response to the first program control signal (PGM1). Each of the first to fourth groups of the page buffers PB1 to PB4N has a dual latch structure including a main latch and a cache latch.

The construction and operations of the first to fourth groups of the page buffers PB1 to PB4N will be described in more detail with reference to FIG. 7. The constructions and operations of the first to fourth groups of the page buffers PB1 to PB4N are substantially the same. Therefore, only the first group of the page buffers PB1 to PBN will be described for simplicity. Furthermore, the constructions and operations of the page buffers PB1 to PBN are substantially the same. Therefore, only the page buffer PB1 will be described for simplicity.

Figure 7:
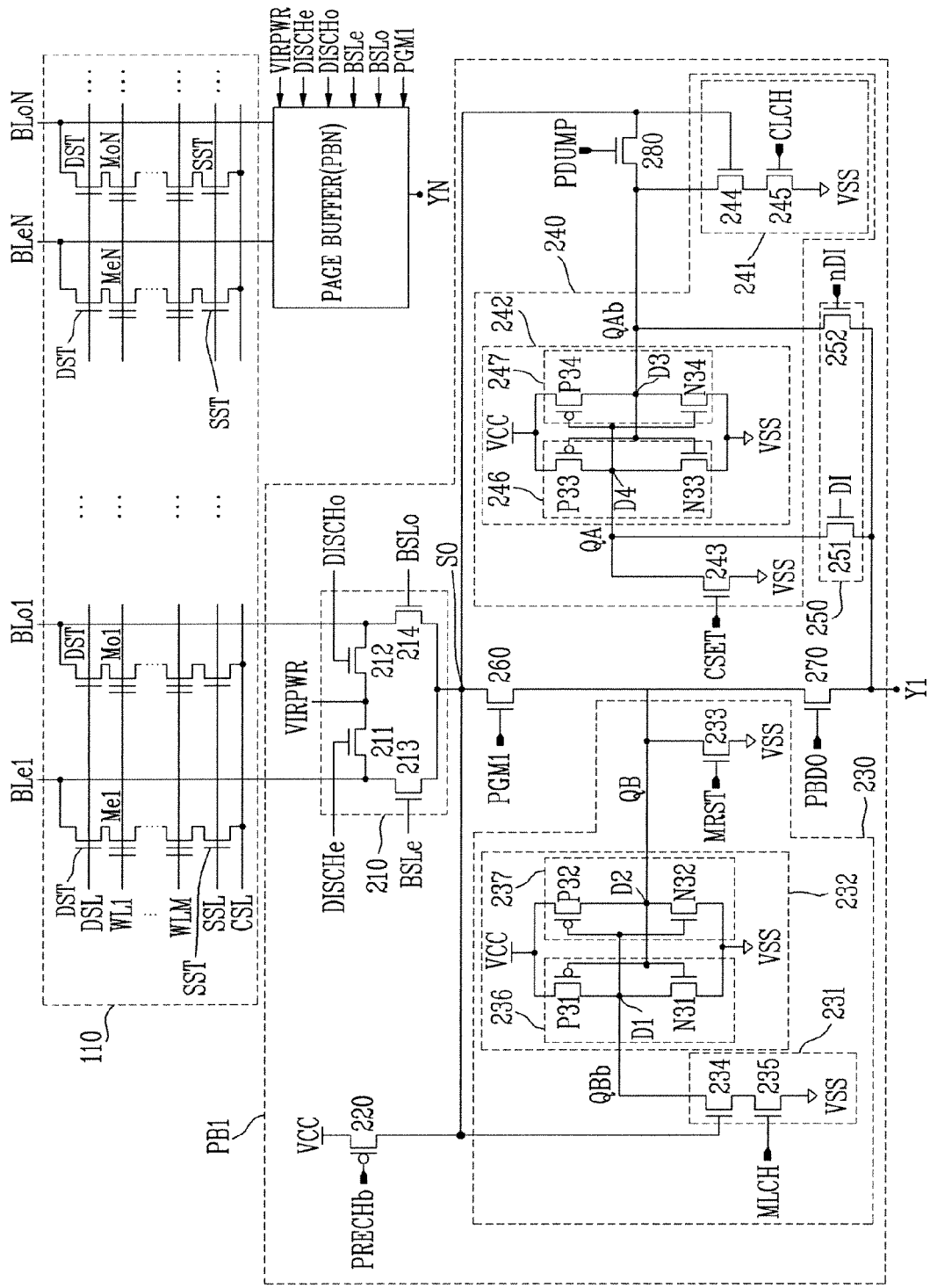
FIG. 7 is a detailed circuit diagram of part of the memory cell block and a first group of page buffers, which are shown in FIG. 3.

Referring to FIG. 7, the first group of the bit line pairs BLe1, BLo1 to BLeN, BLoN are respectively connected to the memory cells Me1, Mo1 to MeN, MoN. Furthermore, to the bit lines BLe1, BLo1 are connected to the page buffer PB1. The page buffer PB1 includes a bit line select unit 210, a precharge circuit 220, a main register circuit 230, a cache register circuit 240, a data input circuit 250 and switches 260, 270 and 280.

The precharge circuit 220 can be formed using a PMOS transistor. Each of the switches 260, 270 and 280 can be formed using an NMOS transistor. The bit line select unit 210 includes NMOS transistors 211 to 214. The NMOS transistors 211, 212 precharge or discharge the bit lines BLe1, BLo1 with a voltage level of the bit line control signal (VIRPWR) in response to the discharge signals (DISCHe, DISCHo), respectively. One of the NMOS transistors 213, 214 is turned on in response to the bit line select signals (BSLe, BSLo). As a result, one of the bit lines BLe1, BLo1 is connected to a sensing node SO. The precharge circuit 220 precharges the sensing node SO with a voltage (VCC) level in response to the precharge control signal (PRECHb).

The main register circuit 230 includes a sensing circuit 231, a main latch 232 and a main latch reset circuit 233. The sensing circuit 231 includes NMOS transistors 234, 235. The sensing circuit 231 senses a voltage level of the sensing node SO in response to a main latch signal (MLCH) and outputs a sensing data (QBb) to a node D1 according to the sensing result. The main latch 232 includes inverters 236, 237. The inverter 236 includes a PMOS transistor P31 and an NMOS transistor N31. The inverter 237 includes a PMOS transistor P32 and an NMOS transistor N32. The main latch 232 latches the sensing data (QBb) received from the sensing circuit 231 and outputs inverted data (QB) to a node D2. The main latch reset circuit 233 initializes the main latch 232 in response to a main latch reset signal (MRST).

The cache register circuit 240 includes a sensing circuit 241, a cache latch 242 and a cache latch reset circuit 243. The cache latch 242 includes inverters 246, 247 connected between nodes D3, D4. The construction and operation of the cache register circuit 240 is the same as those of the main register circuit 230. Description thereof will be omitted.

The data input circuit 250 includes NMOS transistors 251, 252. The NMOS transistor 251 is connected between a node D4 and a data I/O node Y1 and is turned on or off according to a data input signal (DI). The NMOS transistor 252 is connected between the node D3 and the data I/O node Y1 and is turned on or off according to a data input signal (nDI). When data is input to the data input circuit 250, the data I/O node Y1 is set to a ground voltage level. If the NMOS transistor 251 is turned on, data of logic "1" is input to the cache latch 242. If the NMOS transistor 252 is turned on, data of logic "0" is input to the cache latch 242.

The switch 260 is connected between the sensing node SO and the node D2 and is turned on or off according to the first program control signal (PGM1). In the program operation, if the switch 260 is turned on, it outputs the inversed data (QB) (i.e., program data, which is received from the cache latch 232, to the sensing node SO. The switch 270 is connected between the node D2 and the data I/O node Y1 and outputs the inversed data (QB) (i.e., read data), which is received from the main latch 232, to the data I/O node Y1 in response to a control signal (PBDO) in the read operation. The switch 280 is connected between the node D3 and the sensing node SO and is turned on or off according to a control signal (PDUMP). When the switch 280 is turned on, the switch 280 outputs the sensing data (QAb), which is received from the cache latch 242, to the sensing node SO.

Referring back to FIG. 3, the program control unit 120 includes a micro controller 121, a logic circuit 122 and first to third delay circuits 123 to 125. The micro controller 121 outputs an internal program signal (PGM) in response to a program command (PROGRAM). The logic circuit 122 outputs the first program control signal (PGM1) in response to the internal program signal (PGM). The first delay circuit 123 delays the first program control signal (PGM1) for a first setting time (T1, see FIG. 8) and outputs the delayed signal as the second program control signal (PGM2). The second delay circuit 124 delays the first program control signal (PGM1) for a second setting time (T2, see FIG. 8) and outputs the delayed signal as the third program control signal (PGM3).

The third delay circuit 125 delays the first program control signal (PGM1) for a third setting time (T3, see FIG. 8) and outputs the delayed signal as the fourth program control signal (PGM4). The third setting time (T3) can be longer than the second setting time (T2) and the second setting time can be longer than the first setting time (T1). For example, when the first setting time (T1) is set to 50 ns, the second setting time (T2) can be set to 100 ns and the third setting time (T3) can be set to 150 ns.

A case where the program control unit 120 generates the first to fourth program control signals (PGM1 to PGM4) has been described as an example with reference to FIG. 3. However, the number of the program control signals generated by the program control unit 120 can be increased or decreased, if appropriate. This can be realized by increasing or decreasing the number of delay circuits included in the program control unit 120. Furthermore, when the number of program control signals generated by the program control unit 120 is increased or decreased, the number of groups of page buffers can be increased or decreased corresponding to the number of the program control signal.

Figure 4:
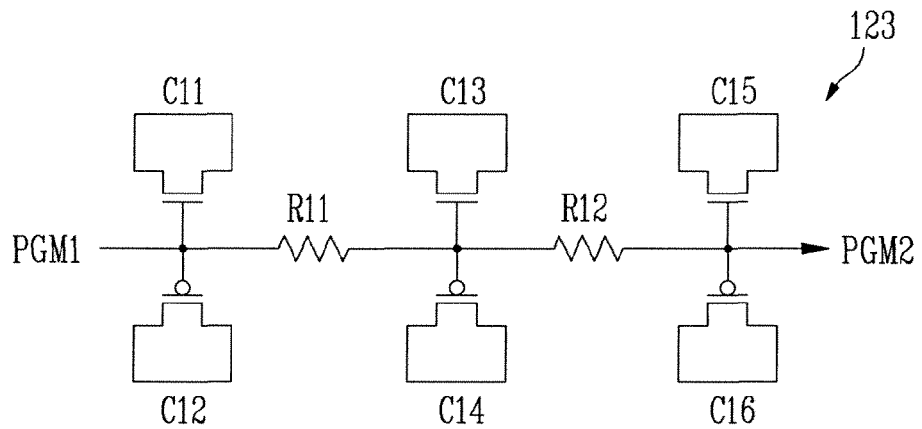
FIG. 4 is a detailed circuit diagram of a first delay circuit shown in FIG. 3.

FIG. 4 is a detailed circuit diagram of the first delay circuit 123 shown in FIG. 3.

Referring to FIG. 4, the first delay circuit 123 includes resistors R11, R12 and capacitors C11 to C16. The resistors R11, R12 are connected in series. The capacitors C11, C12 are connected to one terminal of the resistor R11 in parallel. The capacitors C15, C16 are connected to one terminal of the resistor R12 in parallel. Each of the capacitors C11, C13 and C15 can be formed using an NMOS transistor and each of the capacitors C12, C14 and C16 can be formed using a PMOS transistor.

Furthermore, the capacitors C13, C14 are connected to the resistors R11, R12 in parallel. The first program control signal (PGM1) is delayed for the first setting time (T1) after passing through the resistors R11, R12 and the capacitors C11 to C16, so that the delayed signal is output as the second program control signal (PGM2).

Figure 5:
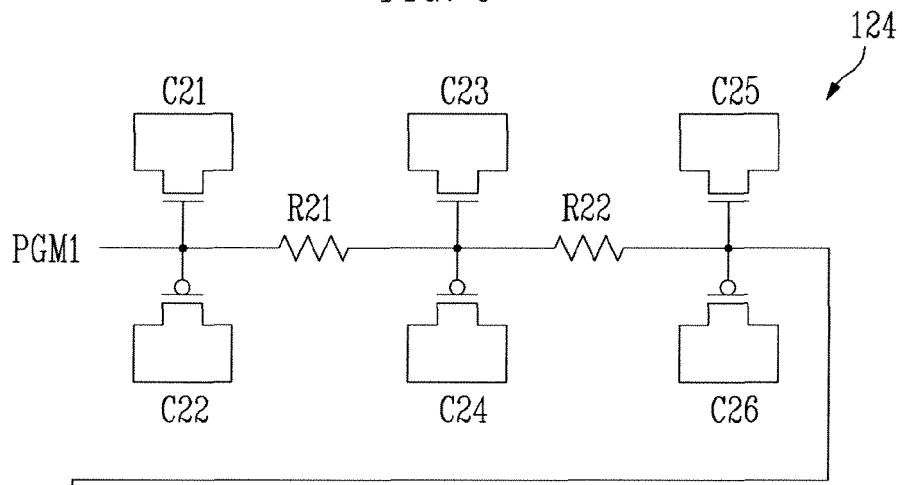
FIG. 5 is a detailed circuit diagram of a second delay circuit shown in FIG. 3.
Figure 5:
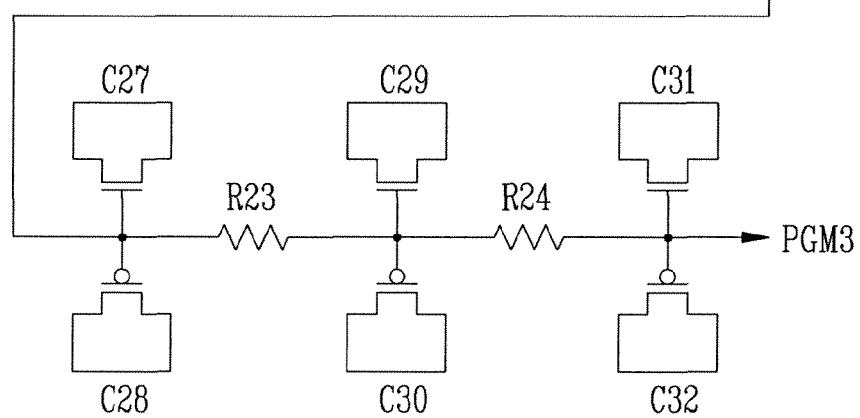

FIG. 5 is a detailed circuit diagram of the second delay circuit 124 shown in FIG. 3.

Referring to FIG. 5, the second delay circuit 124 includes resistors R21 to R24 and capacitors C21 to C32. The construction and operation of the second delay circuit 124 are the same as those of the first delay circuit 123, which have been described with reference to FIG. 4, except for the number of the resistors and the capacitors included in the second delay circuit 124. Description thereof will be omitted.

Figure 6:
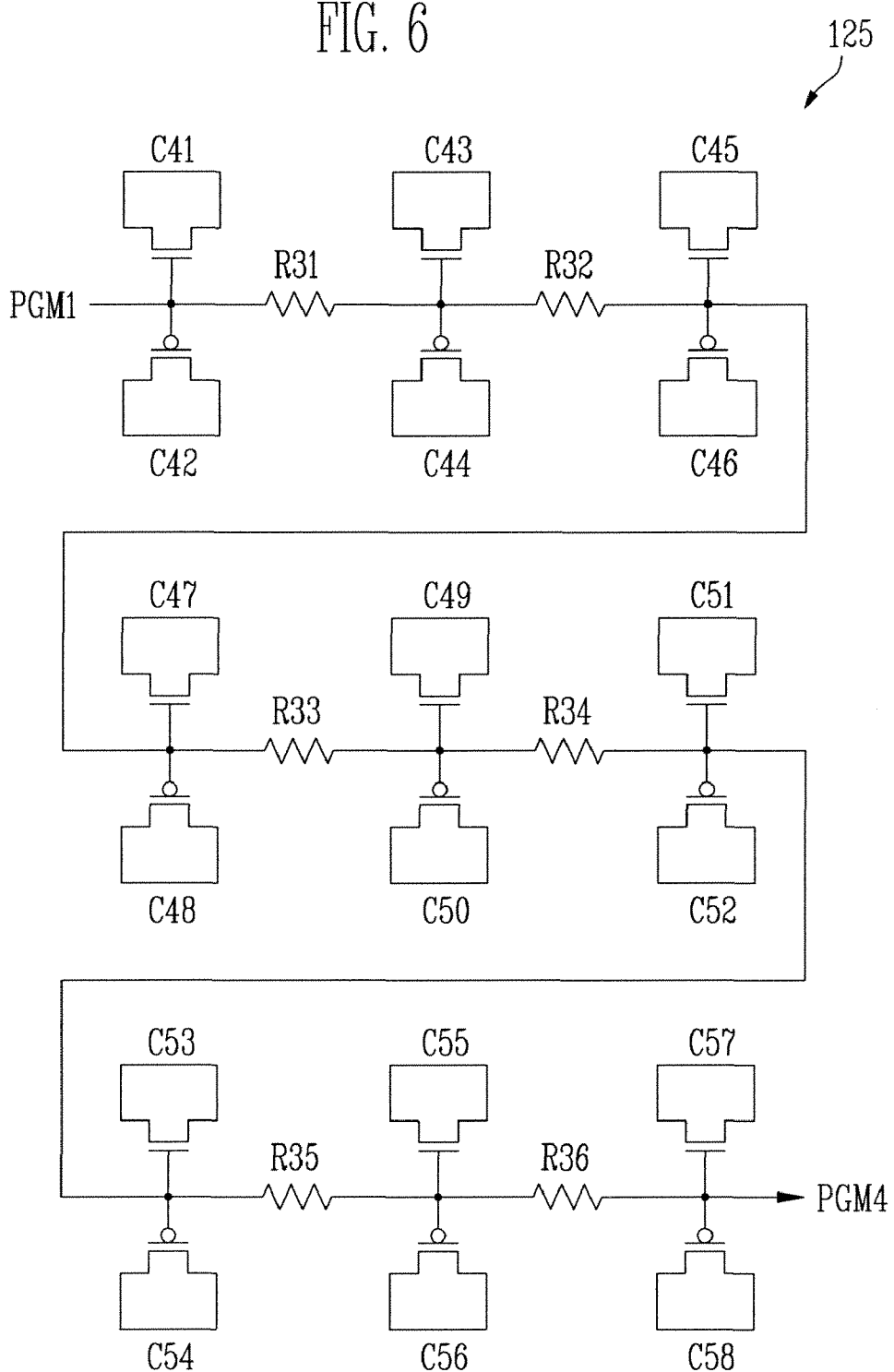
FIG. 6 is a detailed circuit diagram of a third delay circuit shown in FIG. 3.

FIG. 6 is a detailed circuit diagram of the third delay circuit 125 shown in FIG. 3.

Referring to FIG. 6, the third delay circuit 125 includes resistors R31 to R36 and capacitors C41 to C58. The construction and operation of the third delay circuit 125 are same as those of the first delay circuit 123, which have been described with reference to FIG. 4, except for the number of the resistors and the capacitors included in the third delay circuit 125. Description thereof will be omitted.

The program operation process of the flash memory device 100 will be further described with reference to FIG. 8. FIG. 8 is a timing diagram of signals related to the program operation of the flash memory device shown in FIG. 3.

The first program data (QB) is stored in the main latch 232 of each of the first to fourth groups of the page buffers PB1 to PB4N. More particularly, the data (QA or QAb) is stored in the cache latch 242 through the data input circuit 250 and the switch 280 transfers the data (QA or QAb) to the main latch 232 through the sensing node SO. As a result, the first program data (QB) is stored in the main latch 232.

As shown in FIG. 8, the discharge signal (DISCHe) and the bit line control signal (VIRPWR) are enabled. As a result, the bit lines BLe1 to BLe4N are precharged with a voltage level of the bit line control signal (VIRPWR) by means of the bit line select unit 120 of the first to fourth groups of the page buffers PB1 to PB4N. Furthermore, though not shown in FIG. 8, when the bit lines BLe1 to BLe4N are precharged, the bit lines BLo1 to BLo4N are also precharged with a voltage level of the bit line control signal (VIRPWR).

Meanwhile, a program voltage (not shown) is supplied to a word line (e.g., WL1) of a selected page of the plurality of pages of the memory cell block 110. Furthermore, as the bit line select signal (BSLe) is enabled, the bit lines BLe1 to BLe4N are connected to the sensing nodes SO of the first to fourth groups of the page buffers PB1 to PB4N, respectively, by means of the bit line select units 210 of the first to fourth groups of the page buffers PB1 to PB4N.

The micro controller 121 of the program control unit 120 outputs the internal program signal (PGM) in response to the program command (PROGRAM). The logic circuit 122 outputs the first program control signal (PGM1) in response to the internal program signal (PGM). The switch 260 of each of the first group of the page buffers PB1 to PBN is turned on according to the first program control signal (PGM1). As a result, the first program data (QB) stored in each of the main latch 232 of the page buffers PB1 to PBN are output to the memory cells Me1 to MeN respectively connected to the bit lines BLe1 to BLe4N.

After the first setting time (T1) elapses since the logic circuit 122 outputs the first program control signal (PGM1), the first delay circuit 123 outputs the second program control signal (PGM1). The second group of the page buffers PB(N+1) to PB2N outputs the first program data stored therein to the memory cells Me(N+1) to Me2N connected to the bit lines BLe(N+1) to BLe2N, respectively, in response to the second program control signal (PGM1) in the same manner as the first group of the page buffers PB1 to PBN.

Furthermore, after the second setting time (T2) elapses since the logic circuit 122 outputs the first program control signal (PGM1), the second delay circuit 124 outputs the third program control signal (PGM3). The third group of the page buffers PB 2N+1 to PB3N outputs the first program data stored therein to the memory cells Me(2N+1) to Me3N connected to the bit lines BLe(2N+1) to BLe3N, respectively, in response to the third program control signal (PGM3) in the same manner as the first group of the page buffers PB1 to PBN.

Furthermore, after the third setting time (T3) elapses since the logic circuit 122 outputs the first program control signal (PGM1), the third delay circuit 125 outputs the fourth program control signal (PGM4). The fourth group of the page buffers PB(3N+1) to PB4N outputs the first program data stored therein to the memory cells Me(3N+1) to Me4N connected to the bit lines BLe(3N+1) to BLe4N, respectively, in response to the fourth program control signal (PGM4) in the same manner as the first group of the page buffers PB1 to PBN. Meanwhile, while the first to fourth program control signals (PGM1 to PGM4) are sequentially output by the program control unit 120, the second program data (QAb) for a next program operation are stored in the cache latch 242 of each of the first to fourth groups of the page buffers PB1 to PB4N.

As described above, in the flash memory device 100, in the program operation, the page buffers PB1 to PB4N do not output program data at the same time, but only part of (PB1 to PBN or PB(N+1) to PB2N or PB(2N+1) to PB3N or PB(3N+1) to PB4N of the page buffers PB1 to PB4N output program data. As a result, the amount of current flowing to the ground through the sensing nodes SO, the switch 260 and the main latch 232 corresponding to some of the bit lines BLe1 to BLeN or BL(N+1) to BL2N or BL(2N+1) to BL3N or BL(3N+1) to BL4N is reduced. This can reduce the rise of the ground voltage. Therefore, during a program cycle, when data are input to the cache latch 242 of the page buffers PB1 to PB4N, erroneous data can be prevented from being input to the cache latch 242 of the page buffers PB1 to PB4N.

As described above, according to a flash memory device and program operation control method thereof, page buffers are divided into a predetermined number of groups and a program operation is performed on a group basis. Therefore, in a cache program operation, a ground voltage can be prevented from rising and erroneous data can be prevented from being input to a cache latch.

Although certain examples of methods and apparatus constructed in accordance with the teachings of the invention have been described herein, the scope of coverage of this patent is not limited thereto. On the contrary, this patent covers all embodiments of the teachings of the invention fairly falling within the scope of the appended claims literally or under the doctrine of equivalents.

What is claimed is:

1. A method of controlling a program control of a flash memory device, comprising:
   storing a first program on main latches of each of a plurality of page buffer groups;
   precharging bit line groups corresponding to each page buffer group;
   generating first program control signal and a plurality of second program control signals, wherein a first program control signal is generated in response to an internal program signal which is response to a program command and is provided to a first page buffer group and the plurality of second program control signals are sequentially generated by respectively delaying the first program control signal, and sequentially provided to remain page buffer groups; and;
   sequentially discharging the respective bit line groups by connecting the respective bit line groups to the main latches in response to first program control signal and a plurality of second program control signals.

2. The method of claim 1, further comprising, prior to generating first program control signal and a plurality of second program control signals:
   supplying a program voltage to a word line to which memory cells of a selected page are connected; and
   connecting the bit line groups to sensing nodes of the first page buffer groups and the remain page buffer groups.

3. The method of claim 1, wherein generating first program control signal and a plurality of second program control signals comprises:
   outputting the internal program signal in response to the program command;
   outputting the first program control signal in response to the internal program signal;
   delaying the first program control signal for a first setting time and outputting the signal delayed for the first setting time as a first signal among the second program control signal;
   delaying the first program control signal for a second setting time and outputting the signal delayed for the second setting time as a second signal among the second program control signal; and
   delaying the first program control signal for a third setting time and outputting the signal delayed for the third setting time as a third signal among the second program control signal.

4. The method of claim 3, wherein the third setting time is longer than the second setting time and the second setting time is longer than the first setting time.

* * * * *